United States Patent [19]
Banker et al.

[11] Patent Number: 5,258,661
[45] Date of Patent: Nov. 2, 1993

[54] HIGH NOISE TOLERANCE RECEIVER

[75] Inventors: Dennis C. Banker, Newburgh; Jack A. Dorler, Holmes; Walter S. Klara, Hopewell Junction; Francesco M. Masci, Wappingers Falls, all of N.Y.

[73] Assignee: International Business Machines Corporation, Armonk, N.Y.

[21] Appl. No.: 870,653

[22] Filed: Apr. 20, 1992

[51] Int. Cl.$^5$ ........................ H03K 3/29; H03K 5/153
[52] U.S. Cl. .................................. 307/290; 307/359
[58] Field of Search .............. 307/290, 350, 359-443, 307/475

[56] References Cited

U.S. PATENT DOCUMENTS

| | | |
|---|---|---|
| 4,435,654 | 3/1984 | Koide . |
| 4,551,639 | 11/1985 | Takeda et al. . |
| 4,587,444 | 5/1986 | Emori et al. . |
| 4,609,834 | 9/1986 | Gal . |
| 4,626,889 | 12/1986 | Yamamoto et al. . |
| 4,634,897 | 1/1987 | Yoshioka ........................ 307/359 |
| 4,857,776 | 8/1989 | Khan . |
| 4,980,579 | 12/1990 | McDonald et al. . |
| 4,987,318 | 1/1991 | Burke et al. . |
| 5,068,544 | 11/1991 | Ishiguro et al. .................. 307/359 |

*Primary Examiner*—Jin F. Ng
*Assistant Examiner*—Sinh Tran
*Attorney, Agent, or Firm*—Whitham & Marhoefer

[57] ABSTRACT

This invention contemplates the provision of a noise immune integrated circuit receiver in which the voltage reference to one side of an emitter-coupled current switch moves in response to the input signal, in a direction opposite the input signal. This provides the gate with a threshold hysteresis, making it immune to noise without requiring a large swing in input signal.

3 Claims, 1 Drawing Sheet

HIGH NOISE TOLERANCE RECEIVER

BACKGROUND OF THE INVENTION

1. Field of the Invention

This invention relates to an improved integrated circuit logic gate, and more particularly to an emitter-coupled receiver that is relatively immune to noise yet operates in response to a small input signal swing.

2. Description of the Prior Art

Digital signal communication from one semiconductor chip to another semiconductor chip typically takes place in an environment which introduces a relatively large noise component on the input to the receiver. Such receivers commonly operate in conjunction with a large number of simultaneously switching drivers, further increasing the margin of noise immunity required. To operate reliably in the presence of receiver input and power supply noise, digital communications between chips usually requires a large swing in signal input to the receiver. But generating large signal swing requires more power and also increases signal switching delay.

SUMMARY OF THE INVENTION

An object of this invention is the provision of an integrated circuit, emitter coupled, logic gate that operates in response to a relatively small swing with a high degree of noise immunity. A gate with a small number of transistor elements.

Briefly, this invention contemplates the provision of a noise immune, emitter-coupled logic circuit comprised of two emitter-coupled current switches. Each switch has a matched pair of bipolar transistors; one transistor of each pair referred to here for convenience as an input transistor and the other as a reference transistor. The base of the input transistor of each pair is coupled to an input terminal while the base-emitter voltage of the reference transistor of the pair determines the input level at which current switching takes place. The collector node of one input transistor is coupled to the base of the two reference transistors so that, as the input changes the base-emitter references change, but in a direction opposite to the input change, providing noise immunity without requiring a large swing in input signal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
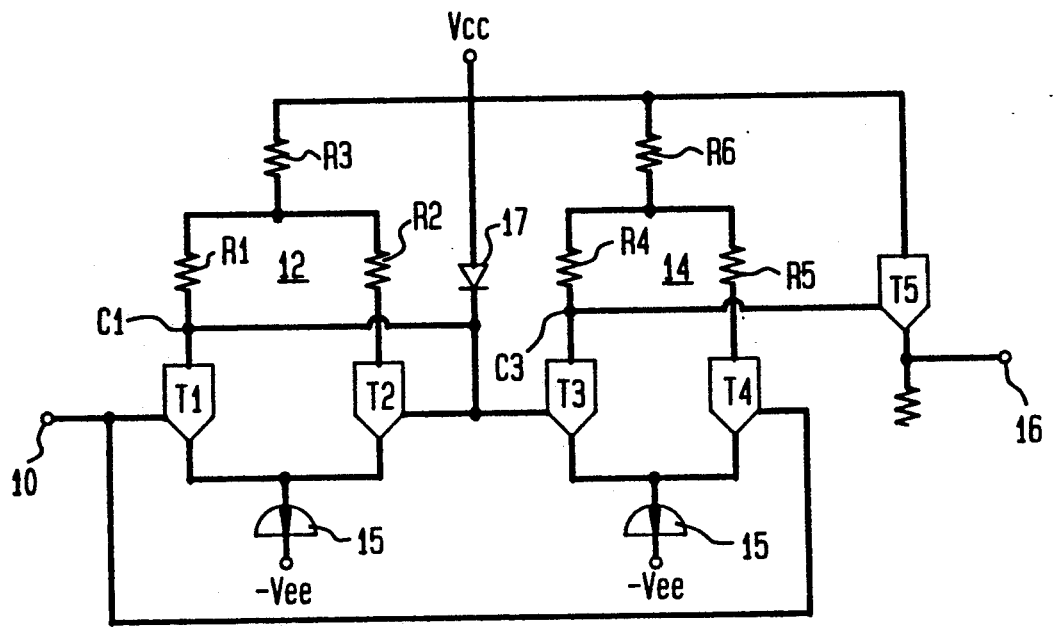
FIG. 1 is a schematic diagram of an integrated circuit receiver in accordance with the teachings of this invention.

Referring now to FIG. 1, an input terminal 10 is coupled in parallel to two emitter-coupled current switches indicated respectively by the general reference numerals 12 and 14. Switch 12 is comprised of emitter coupled NPN transistors T1 and T2 and switch 14 is comprised of emitter coupled NPN transistors T3 and T4. Input terminal 10 is coupled to the base of transistor T1 and the base of transistor T4. Each emitter coupled transistor pair is coupled to a suitable constant current source, as indicated in the drawing. Resistors R1 through R6 couple the transistors T1–T4 to a positive potential Vcc and provide a proper operating bias to the circuit elements.

A collector node C1 of transistor T1 is coupled to the base of transistor T2 and to the base of transistor T3. Diode 17 acts as a clamp to accurately control the reference voltage at the base of transistor T2 and transistor T3 when the input terminal is in a down level. Here it will be appreciated that the C1 collector node voltage establishes the input level at which current switching between T1 and T2 and between T3 and T4 occurs. Emitter follower transistor T5 couples transistor T3 collector node C3 to an output terminal 16.

In operation, when the input to terminal 10 is at a down level, transistor T1 is cut-off and the entire constant current of switch 12 is carried by transistor T2. Similarly, T4 is cut-off and T3 conducts the entire current of switch 14. In this state, collector node C1 is at a high level, placing a relatively high voltage at the base of transistor T2 and transistor T3. This relatively high level at the base of T2 and T3 provides a high margin to noise on the input terminal 10. Similarly, when the input terminal 10 is at its up level, transistors T1 and T4 conduct, and transistors T2 and T3 are cut-off. Collector node C1 in this state is at a low level providing a low reference to the base of R2 and R3 thus providing a high margin to noise in the up level.

Figure 2:
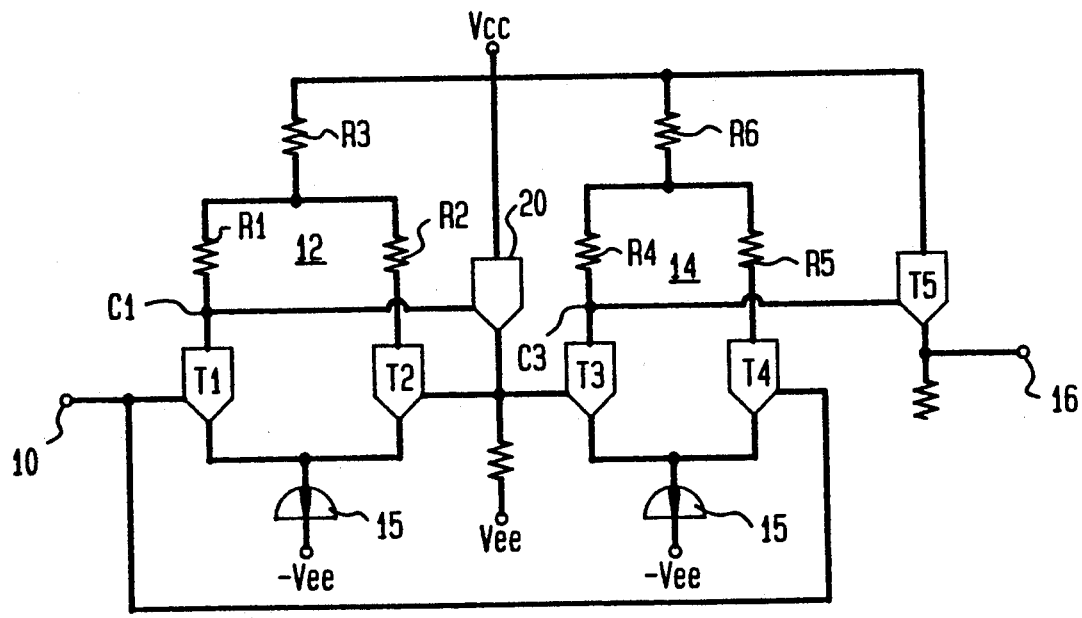
FIG. 2 is a schematic diagram similar to FIG. 1 of a preferred embodiment of a receiver in accordance with the teachings of the invention.

Referring now to FIG. 2, in this preferred embodiment of the invention, the diode 17 in the circuit of FIG. 1 is replaced by an emitter-follower transistor 20 that serves to control the reference voltage at the base of transistors T2 and T3. Otherwise, the structure and operation of the embodiment shown in FIG. 2 is as described in connection with FIG. 1.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An integrated circuit logic gate with a high noise tolerance, comprising in combination:

a first pair of emitter-coupled transistors and a second pair of emitter-coupled transistors, each of said transistors having a base node, an emitter node and a collector node;

a constant current source, and first means coupling said constant current source to said emitter nodes of said first and said second transistor pairs;

an input terminal coupled in parallel to the base of one transistor of said first transistor pair and to the base of one transistor of said second transistor pair; and an emitter follower transistor coupling the collector node of said one transistor of said first transistor pair to the base node of the other transistor of said first transistor pair and to the base node of said other transistor of said second transistor pair, so that said collector node of said one transistor establishes the base-emitter reference for each transistor pair and said base emitter reference moves in a direction opposite the direction of an input to said input terminal.

2. An integrated circuit logic gate as in claim 1, further including third means to couple the collector node of said other transistor of said second transistor pair to an output terminal for said logic gate.

3. An integrated circuit logic gate with a high noise tolerance, comprising in combination:

a first pair of emitter-coupled transistors and a second pair of emitter-coupled transistors, each of said transistors having a base node, an emitter node and a collector node;

a constant current source, and first means coupling said constant current source to said emitter nodes of said first and said second transistor pairs;

an input terminal coupled in parallel to the base of one transistor of said first transistor pair and to the base of one transistor of said second transistor pair; and a diode coupling the collector node of said one transistor of said first transistor pair to the base node of the other transistor of said first transistor pair and to the base node of said other transistor of said second transistor pair, so that said collector node of said one transistor establishes the base-emitter reference for each transistor pair and said base emitter reference moves in a direction opposite the direction of an input to said input terminal.

* * * * *